United States Patent [19]

Skarp

[11] Patent Number: 4,486,487
[45] Date of Patent: Dec. 4, 1984

[54] COMBINATION FILM, IN PARTICULAR FOR THIN FILM ELECTROLUMINESCENT STRUCTURES

[75] Inventor: Jarmo I. Skarp, Helsinki, Finland

[73] Assignee: Oy Lohja Ab, Virkkala, Finland

[21] Appl. No.: 488,178

[22] Filed: Apr. 25, 1983

[30] Foreign Application Priority Data

May 10, 1982 [FI] Finland ................................ 821647

[51] Int. Cl.$^3$ ............................................. B32B 15/04
[52] U.S. Cl. .................................... 428/216; 428/469; 427/87; 427/90
[58] Field of Search .................. 428/469, 216; 427/87, 427/90

[56] References Cited

U.S. PATENT DOCUMENTS 4,058,430 11/1977 Suntola et al. ...................... 156/611
4,175,611 11/1979 Fletcher ............................. 428/469
4,307,147 12/1981 Ohishi et al. ........................ 428/469
4,364,995 12/1982 Crawford et al. ................... 428/469

Primary Examiner—Patricia C. Ives
Attorney, Agent, or Firm—Fitzpatrick, Cella, Harper & Scinto

[57] ABSTRACT

Described herein is a combination film based on aluminium oxide ($Al_2O_3$) and titanium oxide ($TiO_2$), to be used in particular in the thin film electroluminescent structures. Aluminum oxide is an amorphous insulator having a low refraction index, whereas titanium oxide is a chrystalline conductor having a high refraction index. The combination film according to the invention comprises a plurality of alternating aluminium oxide and titanium oxide layers having a thickness of 3 to 1000 Å. preferably 5 to 250 Å. Such a combination film has favorable dielectric strength and refraction index properties and is particularly adapted for use in electroluminescence structures.

8 Claims, 6 Drawing Figures

COMBINATION FILM, IN PARTICULAR FOR THIN FILM ELECTROLUMINESCENT STRUCTURES

The present invention concerns a combination film based on aluminum oxide ($Al_2O_3$) and titanium oxide ($TiO_2$).

Such a film can be prepared most appropriately by growing by the so-called ALE (Atomic Layer Epitaxy) method. This method is described, e.g., in the Finnish patent application Nos. 743473 (U.S. Pat. No. 4,058,430) and 790680.

As to the prior art, reference should also be made to the following publications:

(1) Takeuchi, M. et al: "Dielectric Properties of Sputtered $TiO_2$ Films", *Thin Solid Films,* (51), 1978,
(2) De Wit, H. J. et al: "The Dielectric Breakdown of Anodic Aluminium Oxide", *Journal of Electrochemical Society,* Vol. 123, No. 10, October 1979,
(3) Maissel, L. I. and Glang, R.: *Handbook of Thin Film Technology,* McGraw-Hill
(4) Chopra, K. L.: *Thin Film Phenomena,* McGraw-Hill, N.Y. 1969,
(5) Silvestri, V. J. et al: "Properties of $Al_2O_3$ Film Deposited from the $AlCl_3$, $CO_2$ and $H_2$ System", *J. Electrochem. Soc.* Vol. 125, No. 6, June 1978,
(6) *The Mercx Index,* 9th edition, USA, 1976
(7) Nguyen, T. H. et al: "The Chemical Nature of Aluminium Corrosion: III The Dissolution Mechanism of Aluminium Oxide and Aluminium Powder in Various Electrolytes", *J. Electrochem. Soc.,* Vol. 127, No. 12, December 1980,
(8) Bernard, W. J. et al: "Trapped Oxygen in Aluminium Oxide Films and Its effect on Dielectric Stability", J. Electrochem. Soc., Vol. 127, No. 6 June 1980,
(9) Feuersanger, A. E.: "Titanium Dioxide Dielectric Films Prepared by Vapor Reaction", *Proc. of the IEEE,* December 1964,
(10) Hayashi, S. et al: "Chemical Vapor Deposition on Rutile Films", *Journal of Crystal Growth,* 36, 1976,
(11) Harris, L. A. and Schumacher, R.: "The Influence of Preparation on Semiconducting Rutile ($TiO_2$)" *J. Electrochem. Soc.,* Vol. 127, No. 5, May 1980,
(12) Armigliato, A. et al: "Characterization of $TiO_x$ Films and Their Application as Anti-reflection Coatings for Silicon Solar Cells" *Solar Cells,* (3) 1981.

Aluminum oxide is an amorphous insulation material which is used extensively in the thin film industry. It is prepared by means of all typical thin film preparation methods, beginning from anodization of aluminum metal and ending up in various CVD growings.

The data reported on aluminum oxide involve a great many references, which results both from the great number of processes of preparation and from the different systems of measurement. Table 1 shows typical values reported for aluminum oxide (the range of variation within parentheses).

| $\epsilon_r$ | $V_{br}$/MV $cm^{-1}$ | Q/MV cm | n | Band gap/eV | $\alpha \cdot 10^{-6}$ |
|---|---|---|---|---|---|
| 8.8 (6-10) | 6-8 | 35-70 | 1.55-1.76 | ca 8 | 7 ± 1 |

The decrease of the dielectric coefficient from the typical value of about 9 to 6 is explained as being due to deficient bonding of the oxide structure.

In connection with results of dielectric strength, usually the measurement system is not reported. Hence, it is difficult to compare the values with each other.

A change in the refraction index reflects changes in the density of the substance if the structure remains unchanged in other respects.

Aluminum oxide is chemically very stable. It does not dissolve in water in itself (6). Nor does aluminum hydroxyl $Al(OH)_3$ dissolve. On the contrary, if the film contains chlorine, the dissolution may take place in the form $Al(OH_2)Cl_2^-$ (7). If the aluminum oxide film contains pores, the dissolution of the film can also be explained by their means (8).

Aluminum oxide is one of the ALE films that have been longest in production, but yet there are unexplained variations in its quality. One of the most concrete examples on variations in quality is the dissolution of aluminum oxide in water. At a certain stage (in summer 1981), aluminum oxides dissolved completely in boiling ion-exchanged water. A couple of months later, no dissolution was noticed any longer.

Titanium oxide has three crystal forms: rutile, brookite and anatase. Rutile is the commonest and most stable of them. $TiO_{2-x}$ may also occur in amorphous form. The different properties depend on the crystal form, and, moreover, there are differences in the various crystal orientations.

In thin films, several crystal forms as well as amorphous $TiO_2$ may occur simultaneously. This is why the properties of different films are highly different from each other owing to differences in manufacture. Table 3 shows properties of different thin films.

TABLE 3

| $TiO_2$ | $\epsilon_r$ | $V_{br}$/MV cm | n | $\pi/\Omega$ cm | $E_{gap}$/eV | $\alpha$/heat expansion coeff. |
|---|---|---|---|---|---|---|
| Thin film | 40-60(25-80) | 0.2-0.7 | 2.2-2.8 | $10^4$-$10^7$ ($10^2$-$10^{12}$) | | $8 \cdot 10^{-6}$ |
| Rutile | 117 | | 2.7 | $10^{12}$ | 3 | |
| Brookite | 78 | | | | | |
| Anatase | 31 | | 2.35 | | | |

Electro-optical characteristics of titanium oxide are high dielectric constant ($\epsilon_r$), high refraction index (n), and a specific resistivity ($\rho$) varying within a large range. The large range of variation of the specific resistivity results partly from differences in crystal structures of the films, partly from deficiencies in the films. Oxygen vacancies have a strong effect on conductivity, but so have also some dopants; e.g., fluorine and hydrogen increase the conductivity. It has been reported that oxygen vacancies are produced in vacuum during heat treatment (700° C.), whereby $TiO_2$ delivers oxygen and its conductivity is increased (12). Owing to its rather small width of the forbidden energy gap (3 eV), titanium oxide also has tendencies of photoconductivity.

The crystal structure of a titanium oxide film depends on the manufacturing technique and parameters. When the growing temperature is low (50° to 300° C.), the film is amorphous and, via various mixed forms, ends up in rutile as the temperature rises (13).

The effect of the crystal structure on conductivity has been described in the reference (14), wherein the resistivity and the dielectric constant of a sputtered $TiO_2$ film have been examined as a function of the film thickness.

The resistivity is low up to a thickness of $1\mu$, from which it starts increasing exponentially. Correspondingly, in an X-ray diffraction analysis of the film, it is only at 1 $\mu m$ that signs of crystallized film are noticed (anatase and rutile mixture). The more the film has been crystallized, the lower is the conductivity and the higher the dielectric constant.

The increase in the refraction index of a reactively vaporized $TiO_2$ film as a function of the growing temperature (13), can be explained by means of changes in the crystal structure in the film (amorphous→rutile).

As regards its chemical properties, titanium oxide is highly passive. It does not dissolve in water, in HCl, or in $HNO_3$. It dissolves in hot HF and $H_2SO_4$ (6).

In tests carried out, attempts were made to record properties of an $ALE-TiO_2$ film grown at 500° C., and partly the dependence of those properties from the growing temperature.

Titanium oxide is prepared out of titanium tetrachloride and water. The basic reaction is in accordance with formula 1:

(1) $TiCl_4 + 2H_2O \rightarrow TiO_2 + 4HCl$

It has been reported that the reaction takes place even at temperatures below room temperature in CVD growings (12).

Based on the tests, the following can be said about $TiO_2$ as a summary:

$ALE-TiO_2$ is a strongly crystallizing, decorative film. The film requires an $Al_2O_3$ growing base. As to its material properties, ALE titanium oxide is between an insulator and a conductor. The specific resistivity is $10^6 \Omega cm$. The specific resistivity is extensively a function of the growing temperature.

The measurements of the refraction index were not reliable. However, on the basis thereof, either the titanium oxide is not very dense or the crystal form of the film is something else than rutile.

Chemically, titanium oxide is highly inert. The film could be made to dissolve only in hot concentrated hydrofluoric acid.

In the following table, the properties measured from 500° C. $ALE-TiO_2$ are given.

TABLE 4

| Measured properties of $ALE-TiO_2$. | | |
|---|---|---|
| $\epsilon_r$ | $\pi/\Omega$ cm | n* |
| — | $10^6$ | $2.4 \pm 0.2$ |

*uncertain

It is an object of the present invention to develop a mixed film of titanium oxide and aluminum oxide in which film the dielectric and optical properties lie between the original films. Since high mix ratios had not been obtained by means of simultaneous mixing (1), the new structure has been prepared out of alternating thin $Al_2O_3$ and $TiO_2$ sheets grown layer by layer.

The invention will be discussed in more detail, reference being made to the accompanying drawings, FIG. 1 shows graphically the mix concentrations of two film series according to the present invention as a function of the cycle ratio.

Figure 1:
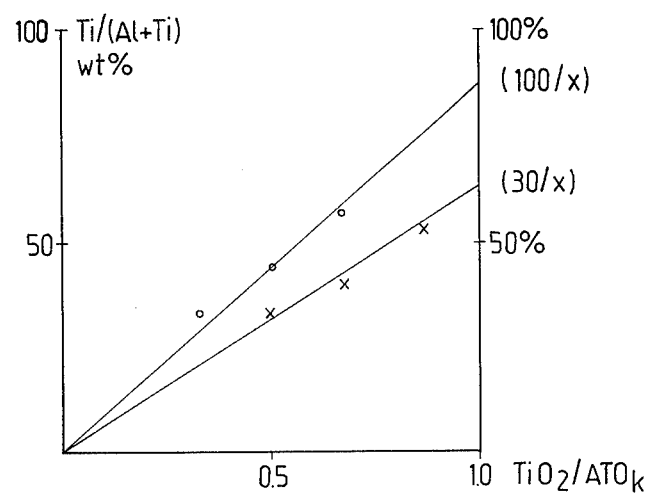

It has been known that, for titanium oxide, values of 40 to 60 had been reported for the dielectric constant and 2.7 for the refraction index. The corresponding values for aluminum oxide are 9 and 1.7. The optimum refraction index for the insulation material placed between ITO (Indium Tin Oxide) and ZnS is the geometric average of the refraction indexes of these substances, about 2.17. If this value is adopted as the starting point and if the mix ratio of $TiO_2/Al_2O_3$ required is calculated, 0.45/0.55 is obtained as this value. Calculated with this ratio, the value 25 is obtained for the $\epsilon_r$ of the insulation material. These values can be considered as an optimum for the combination film.

An $Al_2O_3/TiO_2$ structure grown layer by layer takes advantage of the ease in the ALE technique of controlling the thickness of the film to be grown. Even tough it is not impossible to prepare the layer structure by means of other thin film growing methods, the ALE technique is suited for the layer growing of $TiO_2$ and $Al_2O_3$ more naturally than other methods.

Titanium oxide and aluminum oxide differ from each other to a considerable extent: insulator and conductor, amorphous and crystalline, low and high refraction index. However, when these are placed appropriately as layers one above the other, properties are obtained which partly lie between the properties of the separate materials (refraction index, $\epsilon_r$, crystal structure) and partly differ from the properties of both of them (insulation properties).

The new film preferably consists of very thin (e.g., 50 Å) $Al_2O_3$ and $TiO_2$ layers. When the layer thicknesses are as low as this, it is hard to predict the properties of the films by starting from test results obtained with thicker films. Very thin films have not been studied from the dielectric point of view, so that establishment of the properties of the layer construction requires experimental measurements. The only knowledge that supports the preparation of thin films is that the dielectric properties of insulation films are improved when the thickness of the film is reduced. Tests have shown that the possible practical thickness range of the layers is 3 to 1000 Å, preferably 20 to 100 Å.

The $Al_2O_3$ and $TiO_2$ layers are prepared in the same way as corresponding individual films as discussed above. The only significant specific feature to the growing of film is introduced by an etching reaction (3) between aluminum chloride and titanium oxide:

(3) $4AlCl_3 + 3TiO_2 \rightarrow 3TiCl_4 + 2Al_2O_3$

If the reaction 3 could go on interminably, a layer structure by means of the ALE method out of these starting materials would not be possible. However, the $Al_2O_3$ produced in the reaction acts as a chemical barrier between the titanium oxide and $AlCl_3$, thereby stopping the reaction.

The thickness of the aluminum oxide layer produced can be estimated by means of concentration measurements and of electrical measurements.

FIG. 1 shows the mix ratios of two different combined structures as a function of the cycle ratio.

It is seen from the figure that, in both cases, the curve extrapolated to the cycle ratio 1, i.e., to pure $TiO_2$, remains considerably below 100%. This is due to the etching layer, which acts in the way of a staircase function. The thickness of the etching layer can now be calculated in relation to the rate of growth of titanium oxide. In the case of the 30-series, the value obtained is 13·Ti/c, and in the case of the 100-series correspondingly 11·Ti/c. At a growth rate of 0.5 Å/c of titanium oxide, about 6 Å is obtained as the thickness of the etching layer. This value also coincides with the values obtained by means of optical and electrical measurements (10±5 Å).

The molar volume of aluminum oxide is reported as 26 cm$^3$, that of titanium oxide (rutile) correspondingly as 19 cm$^3$. According to formula (4), the ratio of titanium oxide etched and aluminum oxide formed is obtained as 3/2. When the ratio of the molar volumes is multiplied by this ratio, the ratio of the volumes participating in the reaction is obtained: $V_{TiO2}/V_{Al2O3} = 1.1 \approx 1$. Thus, in the reaction, the thickness of the titanium oxide etched is approximately equal to the thickness of the aluminum oxide formed.

On the basis of the above, it is possible to present a rather roughly estimated formula for the relationship of mix concentration and cycle ratios:

$$Ti/ATO_k = \frac{Ti/c - 12}{Ti/d + Al/c} \%$$

In the above formula, $ATO_k$ denotes the (amount of) combined film material. When the layer thicknesses increase, the relative proportion of the etching layer is reduced. In the case of very thin layer thicknesses, the formula is no longer accurate. The formula assumed constant and equal growth rates, but this is not exactly correct at the beginning of the growth process (surface situation different). In very thin $TiO_2$ layers (<12 cycles), considerable amounts of titanium ($\approx 30\%$) have been found.

The thickness of the layer that is etched does not seem to depend on the dosage concentration of the $AlCl_3$ pulse. The dosage of $AlCl_3$ was varied within the limits of 3 to 6.7 dosage units, and no difference was noticed in the electrical results. Thus, the diffusion of the aluminum chloride in the aluminum oxide is low.

An $ATO_k$ may be made of $Al_2O_3$ and $TiO_2$ layers of highly varying thicknesses. The minimum layer thicknesses depend on the layers produced via the etching reaction. The thickness requirement of the titanium oxide layer is about 10 Å, and that of the aluminum oxide layer is obtained out of the thickness of about 5 Å produced by means of the etching reaction alone. The maximum layer thicknesses are determined on the basis of optical and $TiO_2$-conductivity properties. The order of magnitude of the maximum layer thickness is 25 nm. These determine the layer thicknesses within which the properties of $ATO_k$ can be studied.

Out of the films, the dielectric strength was determined in the same way as described above.

Figure 2:
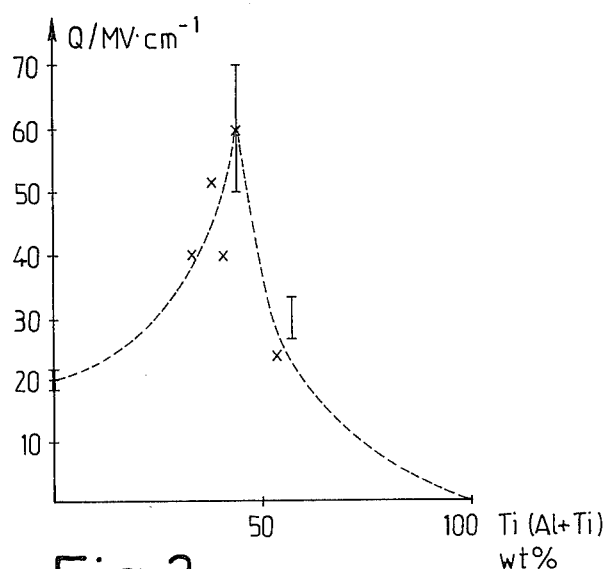
FIG. 2 shows graphically the dielectric strength of a film according to the invention as a function of the mix concentration.

FIG. 2 indicates the measured Q-values as a function of the Ti/Al ratio.

The chemical concentration determinations were made with a precision of 10%. This gives rise to an uncertainty in the results also in the direction of the x-axis. What is concerned is either a very sharp dependence of the dielectric strength on the mix ratio, or there is no such dependence, the value being determined by other factors.

Figure 3:
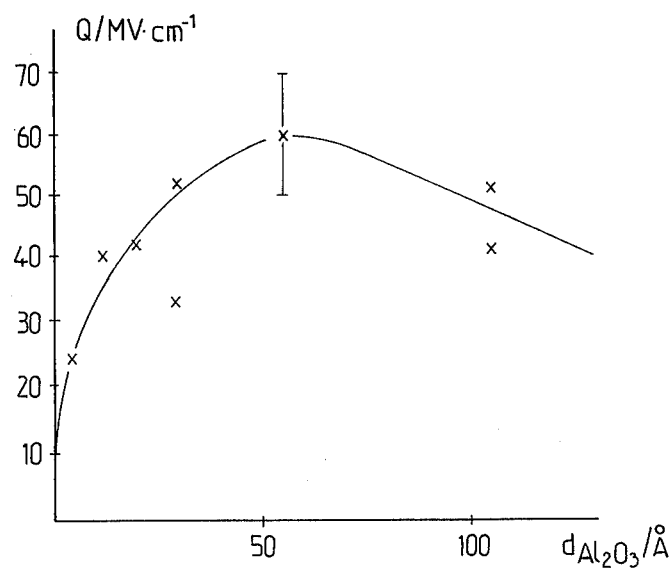
FIG. 3 shows graphically the dielectric strength of a film according to the invention as a function of the thickness of the $Al_2O_3$ layers.

In FIG. 3, the dependence of the Q-value from the thickness of the aluminum oxide layer is presented.

The dielectric properties of the $ATO_k$ film are proportional to the thickness of each individual $Al_2O_3$ layer. The Q-value increases very steeply during the first nanometers (about 5 Å will be produced via etching). The value reaches its maximum at about 60 Å and starts going down gradually as the $Al_2O_3$ film becomes thicker.

No clear interdependence can be found for the dielectric constant of $ATO_k$ in the mix ratio nor in the layer thickness of the aluminum oxide. By means of the mix ratio and of the layer thickness, the overall thickness of the aluminum oxide is obtained. If this value is used as the effective insulation thickness, it is possible to calculate the dielectric constant for different structures, and to compare it with that of aluminum oxide.

Table 5 shows values that were calculated in this way for certain $ATO_k$ structures.

TABLE 5

| Cycle ratio $Al_2O_3/TiO_2$ | Mix ratio $Al/(Al + Ti)$ | $d_{ATOk}$/nm | $d_{Al2O3}$/nm | C/pF | r/μm |
|---|---|---|---|---|---|
| 90/5 | 0.46 | 123 | 57 | 25 | 6.4 |
| 100/50 | 0.43 | 265* | 103 | 14 | 7.2 |
| 100/100 | 0.56 | 273 | 153 | 13 | 9.0 |
| 100/200 | 0.67 | 181 | 121 | 15 | 8.2 |

*estimate

Figure 4:
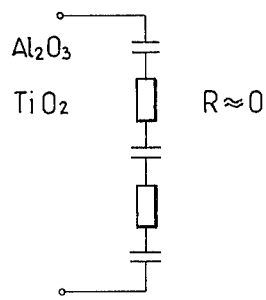
FIG. 4 shows an equivalent electrical circuit representing the dielectric properties of the film according to the invention.

According to this table, the dielectric properties of the $ATO_k$ would result exclusively from thin $Al_2O_3$ layers. Titanium oxide functions as a low-ohmic bond connecting the various insulation layers, FIG. 4.

When the above results are examined, the only property of $ATO_k$ that cannot be explained as an average or combination of the properties of the host films is the dielectric strength.

Titanium oxide is a conductor and aluminum oxide is an insulator, but the insulation properties of $ATO_k$ are three times better than those of aluminum oxide.

As discussed above, when the thickness of an insulation film is reduced, its field withstanding properties are improved.

If calculated what field strengths remain to be carried by the aluminum oxide, for example, in the case of $ATO_k$ (100/100), wherein Q=60 MV·cm$^{-1}$, as the breakthrough field is obtained 6.7 MV·cm$^{-1}$. This value is about three times the value that has been measured with thicker ALE-$Al_2O_3$ films. The value is, however, within an entirely sensible range.

An aluminum oxide layer is formed in two different ways: by means of etching and by means of ALE growing. This may explain why insulation layers as thin as this ($\approx 50$ Å) can be solid. On the other hand, the conductive TiO₂ layers, firstly, mix through the structure and may also, by means of their electrical properties, have an effect improving the field withstanding properties of the overall structure.

Referring to this latter alternative, the breakthrough of a film always takes place at the weakest point of the film. At such a dot-shaped point the field is stronger than elsewhere, and the breakthrough takes place. As a consequence thereof, this point of the film becomes hot, which usually also reduces the field withstanding properties of the nearest environment. Hereby the breakthrough may start proceeding, but it may also stop so that only the electrode is evaporated off at the breakthrough point.

If it is assumed that the breakthrough takes place along a conductivity channel of radius r, the following formula 5 can be written for the breakthrough field:

$$E = \sqrt{\frac{2\eta C\rho}{\epsilon_0 \epsilon_r A} (T_d - T_A)} \cdot r, \quad (5)$$

wherein
$\epsilon_r$, C and $\rho$ are insulation material constants,
A = area of electrode
$T_A$ = temperature of environment
$T_d$ = temperature of insulation material
r = radius of breakthrough conductivity channel.

From this it is seen that the value of the breakthrough field is proportional to the radius r of the conductivity channel.

Figure 5:
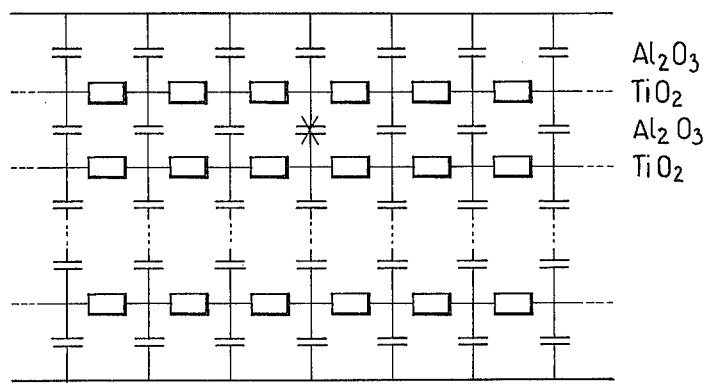
FIG. 5 shows another equivalent electrical circuit of the film according to the invention.

An electrical equivalent circuit can be presented for the $ATO_k$ film as an R-C network, FIG. 5.

Titanium oxide can be considered a series resistance in the horizontal direction and a short circuit in the vertical direction. Correspondingly, aluminum oxide forms successive capacitor planes in the vertical direction.

When the film has some weaker point (in the figure, one capacitor is short-circuited), an increase in the electrical field takes place at this point. However, the titanium oxide resistors now divide the field over a wider area. As transferred to formula 5, this means that the required radius r of the conductivity channel has increased.

Moreover, the energy charged in the capacitance has been divided between all the Al₂O₃ layers, and in the case of a short circuit this energy is discharged through the TiO₂ resistance. In the case of a normal insulation, the entire energy charged in the capacitor has access through the electrodes into the breakthrough channel.

An X-ray diffraction analysis was performed on the $ATO_k$ (100/100) structure at the Finland University of Technology. By means of this analysis, the intention was to find out whether any degree of crystallization can be noticed in the film. In this measurement, no diffraction peaks could be noticed in the film, but the film was noticed to be amorphous.

When comparing SEM pictures of such a film with pictures of films with equal thickness both of Al₂O₃ and of TiO₂, it could be stated that the surface quality of the sample is between said samples. A certain degree of crystallization has taken place in the film.

The circumstance that X-ray diffraction did not give any result indicative of crystallization indicates that the different TiO₂ layers were not at the same phase of crystallization. Since, however, macroscopic crystallization can be noticed in the $ATO_k$, this means that the thin Al₂O₃ layers do not completely cut off the information between the titanium oxide layers. The underlying crystallized layers act upon the layers placed above so that, on a thick film, unevennesses in the film face can already be seen.

Figure 6:
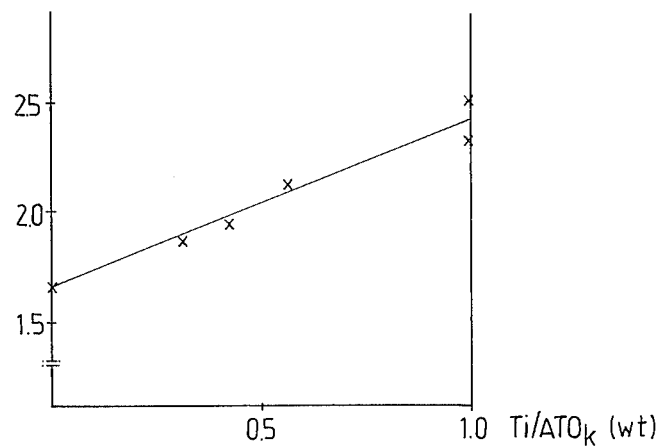
FIG. 6 shows graphically the dependence of the refraction index of a film according to the invention on the mix ratio.

As regards its refraction index, $ATO_k$ lies between its mother films in the way determined by the mix ratio. FIG. 6 shows the dependence of the refraction indexes of $ATO_k$(100/x) structures on the mix ratio.

The effects of layer thicknesses were not studied, but they should not have any effect as long as the optical layer thicknesses are much smaller than the wave length of light.

The etching ability of $ATO_k$ lies between the properties of titanium oxide and aluminum oxide. The HF etching rate decreases when the proportion of titanium oxide increases.

$ATO_k$ (100/100) becomes detached as flakes. The etching boundary is very sharp. This causes difficulties in interferometric thickness measurements.

It is probable that HF penetrates along crystal boundaries through the film and etches either the aluminum oxide placed underneath, or the intermediate layers.

The optimum field withstanding properties of $ATO_k$ are obtained at a layer thickness of 55 Å of aluminum oxide. If this value is fixed, optical adaptation of ITO and ZnS require 73 Å of titanium oxide. In the growing cycles this makes about 160 cycles. The withstanding voltage of the insulation is proportional to the insulation thickness, and, in the case of $ATO_k$, to the overall thickness of the aluminum oxide layer. It follows from this that an $ATO_k$(160/100) structure must be made 30% thicker as compared with a 100/100 structure if a voltage margin is supposed to be retained.

If the overall thickness and processing time of an EL structure are to be kept at a reasonable level, the upper insulation must be made with a higher Al₂O₃ proportion, e.g. 75/150 or 100/200. With this thickness of Al₂O₃ layer, the dielectric strength is still high, and the insulation can be made thinner.

Combination films according to the invention are particularly suitable as insulating layers between the luminescent (ZnS:Mn) layer and the electrode layers (e.g., indium-tin-oxide) as a substitute for prior art Al₂O₃ layers.

What is claimed is:

1. An insulative film for a thin film structure, comprising alternating layers of aluminum oxide (Al₂O₃) and titanium oxide (TiO₂), said film having between 10 and 200 of said layers, wherein each layer has a thickness in the range of 3 to 1000 Å.

2. An insulative film as set forth in claim 1, wherein the thickness of each said layer is in the range of 20–100 Å.

3. An insulative film as set forth in claim 1, wherein the thickness of each said layer is in the range of 40–70 Å.

4. An insulative film as set forth in claim 1, wherein said layers of the film comprise ALE layers.

5. An insulative film as set forth in claim 4, wherein the cycle ratio Al₂O₃/TiO₂ is within the range of 5/500 to 30/5.

6. An insulative film as set forth in claim 1, wherein the weight ratio Ti/(Al+Ti) of the film is in the range of 0.45 to 0.55.

7. An insulative film as set forth in claim 1, wherein the thickness of the Al₂O₃ layers is in the range of 50–70 Å.

8. An insulative film as set forth in claim 1, wherein said layers are of substantially equal thickness.

* * * * *